(12) United States Patent
Kuribayashi et al.

(10) Patent No.: US 6,602,797 B2
(45) Date of Patent: Aug. 5, 2003

(54) WAFER PROCESSING METHOD

(75) Inventors: Hiromitsu Kuribayashi, Kanagawa (JP); Woo Sik Yoo, Palo Alto, CA (US)

(73) Assignees: WaferMasters, Inc., San Jose, CA (US); Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/131,172

(22) Filed: Apr. 23, 2002

(65) Prior Publication Data

US 2002/0119634 A1 Aug. 29, 2002

Related U.S. Application Data

(62) Division of application No. 09/451,677, filed on Nov. 30, 1999, now Pat. No. 6,410,455.

(51) Int. Cl.⁷ .................... H01L 21/31; H01L 21/469
(52) U.S. Cl. .................... 438/758; 438/908; 414/212
(58) Field of Search .................. 438/758, 908; 414/217; 118/729

(56) References Cited

U.S. PATENT DOCUMENTS

| | | | |
|---|---|---|---|
| 4,952,299 A | 8/1990 | Chrisos et al. | 204/298.25 |
| 5,254,170 A | 10/1993 | Devilbiss et al. | 118/719 |
| 5,882,165 A * | 3/1999 | Maydan et al. | 414/217 |
| 5,944,857 A | 8/1999 | Edwards et al. | 29/25.01 |
| 5,947,675 A | 9/1999 | Matsushima | 414/416 |
| 6,036,426 A | 3/2000 | Hillman | 414/331.14 |
| 6,176,667 B1 * | 1/2001 | Fairbairn et al. | 414/217 |
| 6,410,455 B1 * | 6/2002 | Kuribayashi et al. | 438/758 |

FOREIGN PATENT DOCUMENTS

EP    0818807    1/1998

OTHER PUBLICATIONS

SHR3000 Robot datasheet from the JEL Company of Hiroshima, Japan (1page).

* cited by examiner

*Primary Examiner*—Alexander Ghyka
(74) *Attorney, Agent, or Firm*—MacPherson Kwok Chen & Heid LLP

(57) ABSTRACT

A wafer processing system occupies minimal floor space by using vertically mounted modules such as reactors, load locks, and cooling stations. Further saving in floor space is achieved by using a loading station which employs rotational motion to move a wafer carrier into a load lock. The wafer processing system includes a robot having extension, rotational, and vertical motion for accessing vertically mounted modules. The robot is internally cooled and has a heat resistant end-effector, making the robot compatible with high temperature semiconductor processing.

6 Claims, 22 Drawing Sheets

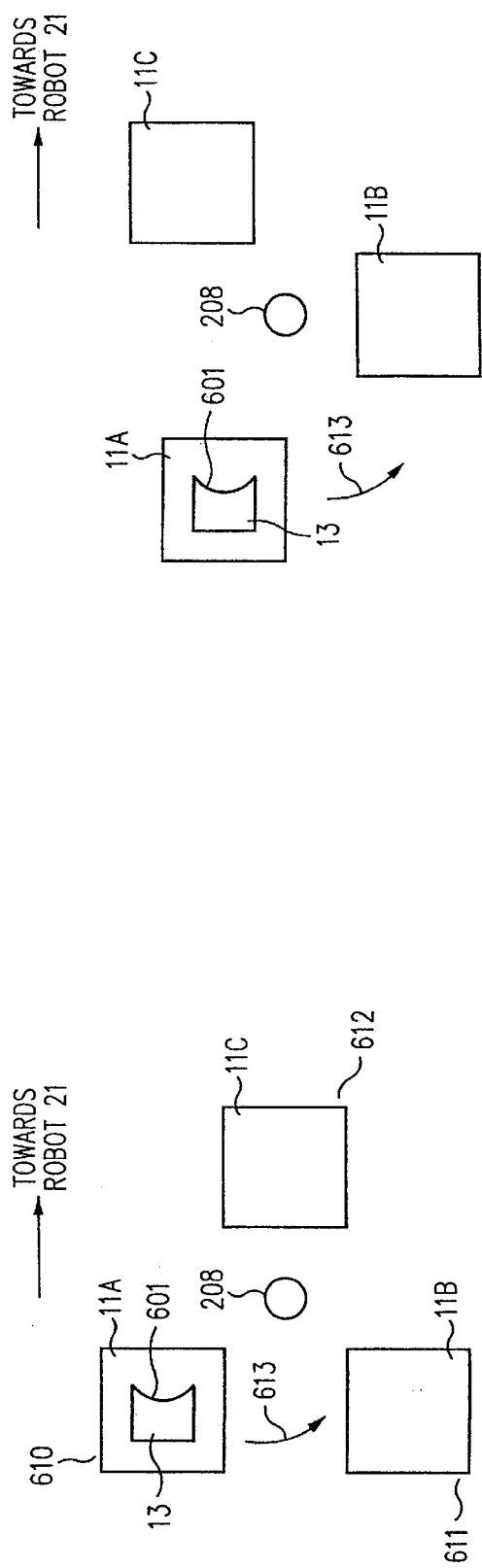
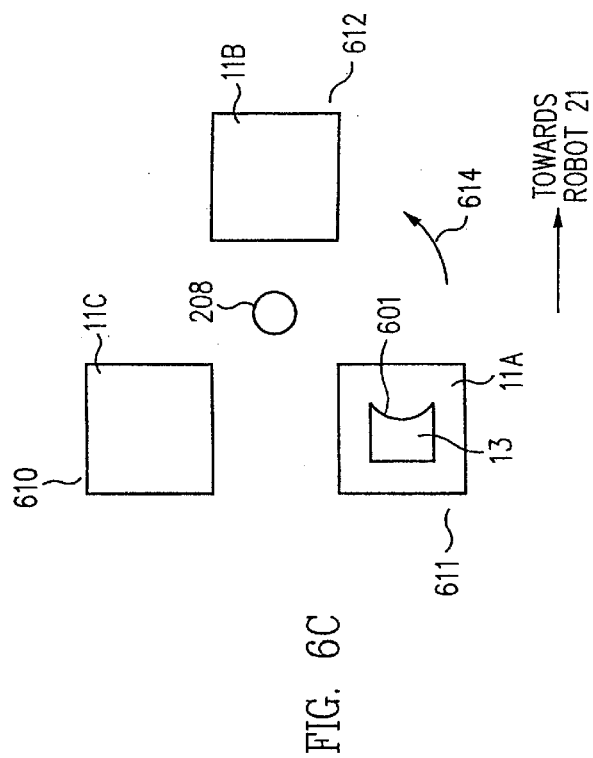
FIG. 6B
FIG. 6C
FIG. 6A

WAFER PROCESSING METHOD

This application is a divisional application of application Ser. No. 09/45 1,677, filed Nov. 30, 1999, now U.S. Pat. No. 6,410,455, which is herein incorporated by reference for all purposes.

BACKGROUND OF THE INVENTION

1. Field of the Invention

This invention generally relates to semiconductor device fabrication and more particularly to systems for processing a semiconductor wafer.

2. Description of the Related Art

Specialized wafer processing systems are used to process semiconductor wafers into electronic devices. In certain of these systems, a carrier containing wafers is loaded into a loading station and transferred to a load lock. Subsequently, a robot picks up a wafer from the carrier and moves the wafer into a reactor (also known as a process chamber). The wafer is processed in the reactor according to a recipe. In a chemical vapor deposition reactor, for example, a thin film of a dielectric material is deposited onto the wafer typically to isolate one layer of the wafer from an overlying layer. Once the film is deposited, the robot picks up and transfers the wafer back to the carrier in the load lock. The carrier is then moved out of the load lock and back into the loading station.

U.S. Pat. No. 5,882,165 to Maydan et al. ("Maydan") discloses a wafer processing system wherein the reactors and other modules of the system are horizontally integrated (i.e. the modules are spread out horizontally). A disadvantage of a horizontally integrated system is that the total floor space area occupied by the wafer processing system increases as more modules, such as reactors and cooling stations, are added to the system. Because floor space in semiconductor fabrication clean-rooms and equipment areas is typically scarce and costly, it is highly desirable to have a wafer processing system which occupies minimal floor space. Further, some components of a horizontally integrated system (e.g. pumps) typically require installation in a remote location because of floor space constraints. A compact wafer processing system is desirable because such a system can be moved, installed, and operated as a single unit in a small contiguous area, thereby obviating the need for complex connections to remotely installed components.

In typical wafer processing systems, robots are employed to automate the movement of wafers between modules. An example of a commercially available wafer processing robot is the SHR3000 robot ("SHR3000 robot") from the JEL Corporation of Hiroshima, Japan (telephone no. 81-849-62-6590). The SHR3000 robot can rotate 340°, has 200 mm of vertical motion, and can extend its arms 390 mm in the horizontal plane. The SHR3000, like typical wafer processing robots, cannot readily access a newly processed wafer from a very hot reactor without spending additional time waiting for the reactor to cool down. This is a concern specially in high temperature wafer processing applications such as rapid thermal processing ("RTP") wherein the reactor can reach temperatures of 1200° C. Further, the SHR3000 robot's 200 mm of vertical motion is not optimum for accessing vertically mounted modules. It is desirable to have a wafer processing robot that can withstand high temperatures and can access vertically mounted modules of varying heights.

SUMMARY OF THE INVENTION

The present invention relates to a wafer processing system which occupies minimal floor space. In one embodiment of the invention, multiple reactors are vertically mounted (i.e. vertically integrated) to save floor space. The invention also uses vertically mounted load locks and cooling stations. Further savings in floor space are achieved by using a loading station which employs rotational motion to move a wafer carrier into a load lock.

The invention also includes a robot for moving a semiconductor wafer within the wafer processing system. The robot not only extends in the horizontal plane and rotates, but also has a range of vertical motion which allows the robot to access vertically mounted reactors, load locks, cooling stations, and other modules. The robot is internally cooled and supports a wafer using a heat resistant end-effector (i.e. "fingers" for lifting a wafer), making the robot compatible with high-temperature semiconductor manufacturing processes.

Other uses, advantages, and variations of the present invention will be apparent to one of ordinary skill in the art upon reading this disclosure and accompanying drawings.

BRIEF DESCRIPTION OF THE DRAWINGS

FIGS. 6A–6E illustrate in graphical form the movement of a platform in the loading station shown in FIGS. 2A and 2B.

DETAILED DESCRIPTION

Figure 1B:
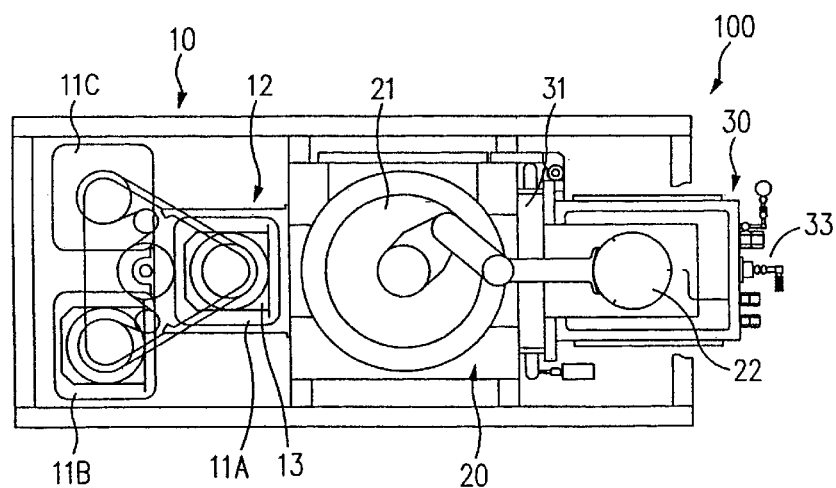
FIGS. 1A and 1B show a side view and a top view, respectively, of a wafer processing system in accordance with the invention.
Figure 1A:
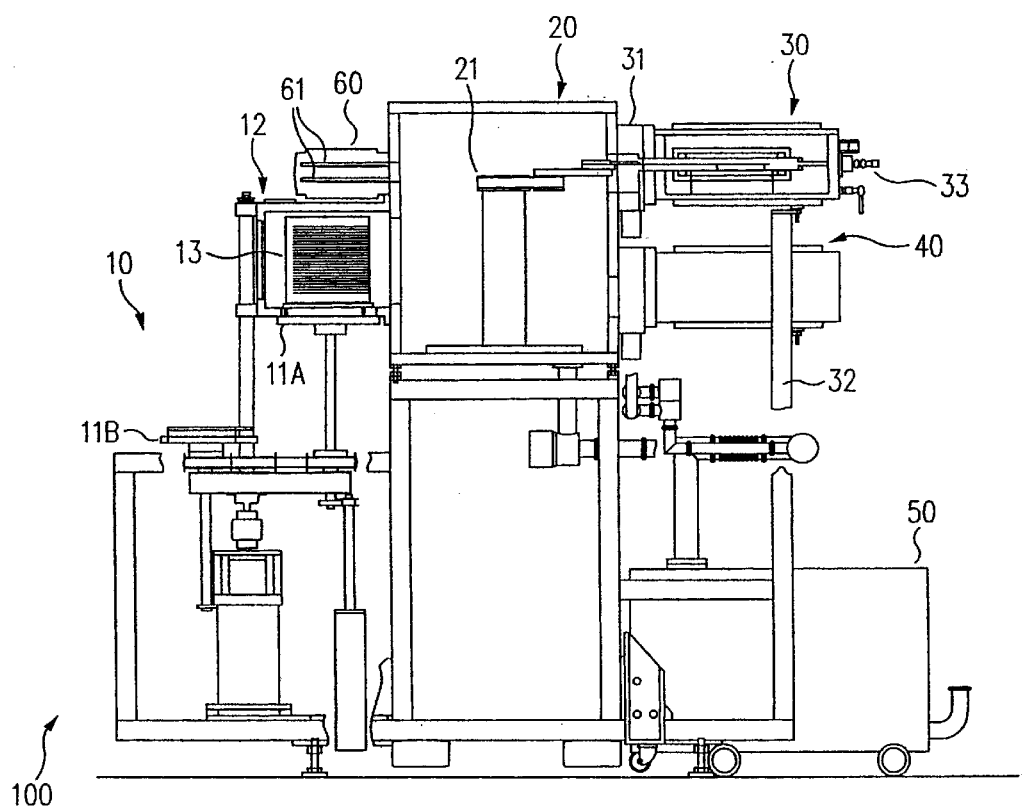

FIGS. 1A and 1B show a side view and a top view, respectively, of a wafer processing system 100 in accordance with the present invention. System 100 includes a loading station 10, a load lock 12, a transfer chamber 20, a robot 21, reactors 30 and 40, and a cooling station 60. Loading station 10 has platforms 11A, 11B, and 11C for supporting and moving wafer carriers, such as a wafer carrier 13, up into load lock 12. While three platforms are used in this embodiment, the invention is not so limited. Two platforms can also be used as can additional platforms to increase throughput. Carrier 13 is a removable wafer carrier which can carry up to 25 wafers at a time. Other types of wafer carriers, including fixed wafer carriers, can also be used. Wafer carriers are loaded onto platforms 11A, 11B, and 11C either manually or by using automated guided vehicles ("AGV").

Figure 2A:
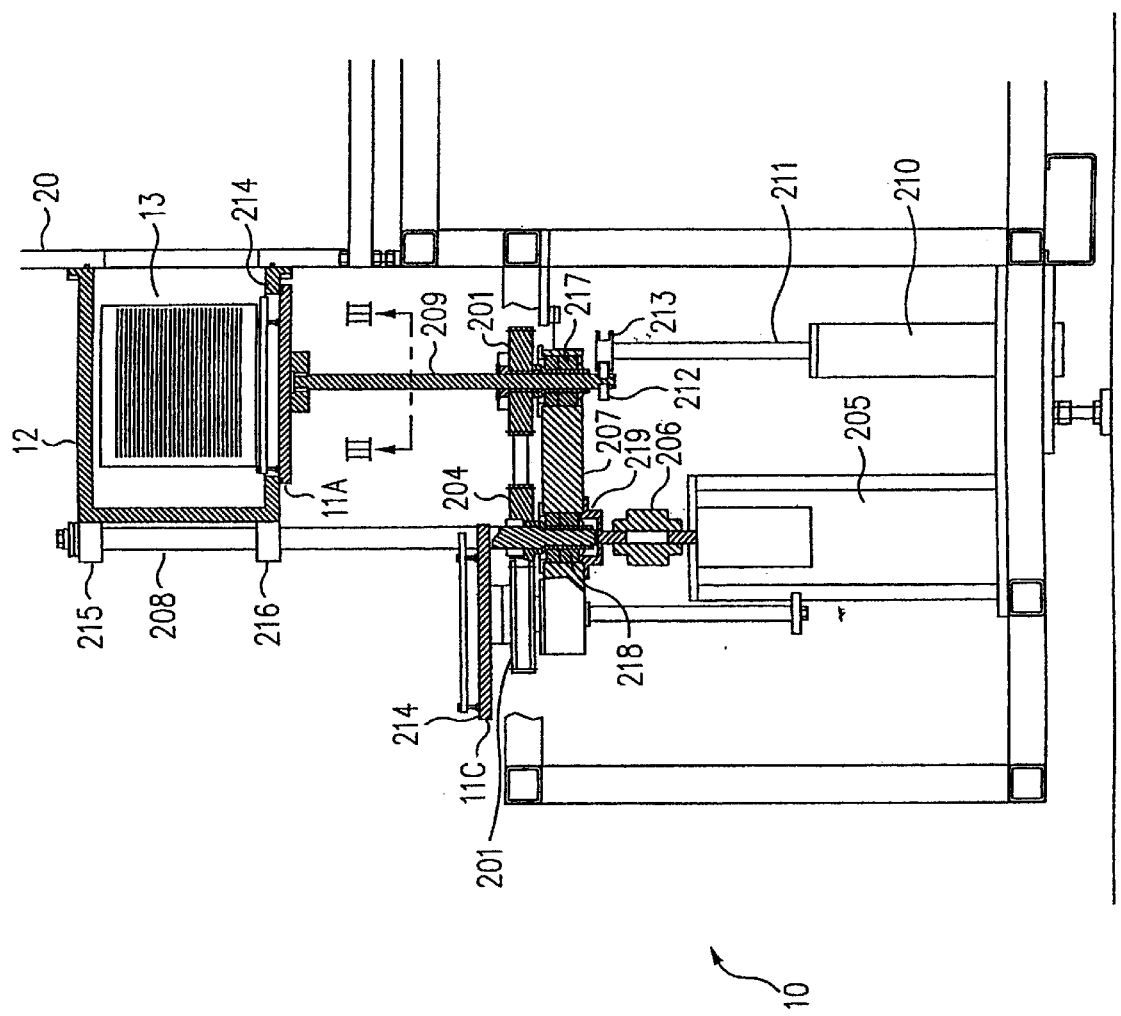
FIGS. 2A and 2B show a side view and a top view, respectively, of a loading station in accordance with the invention.
Figure 2B:
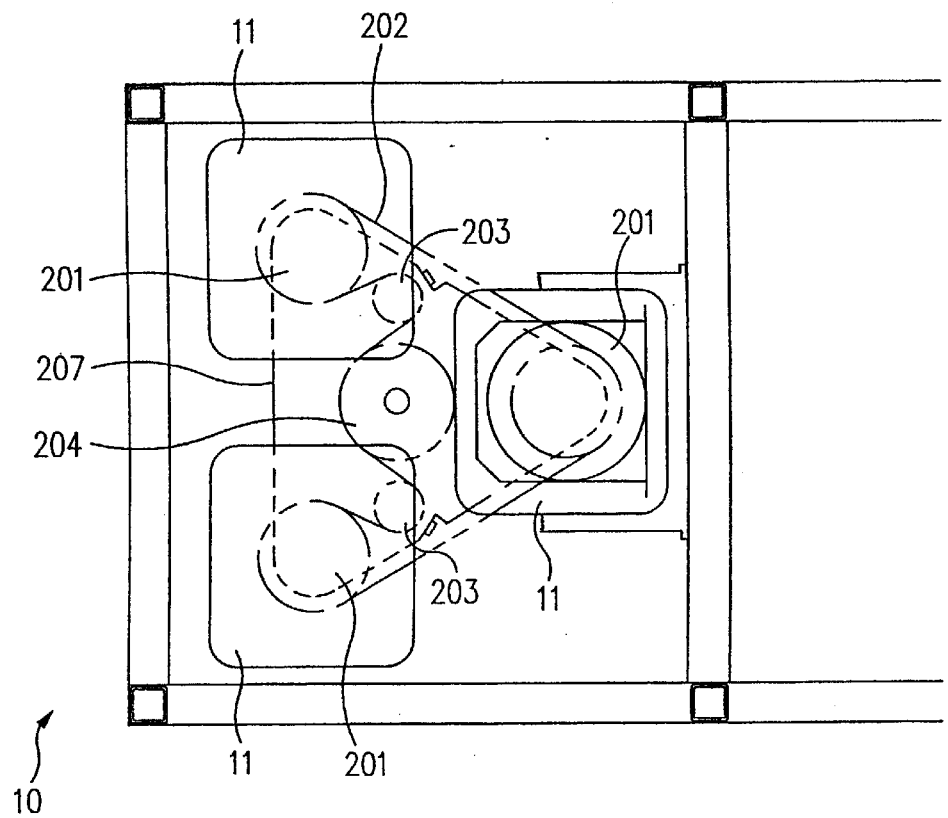
Figure 6E:
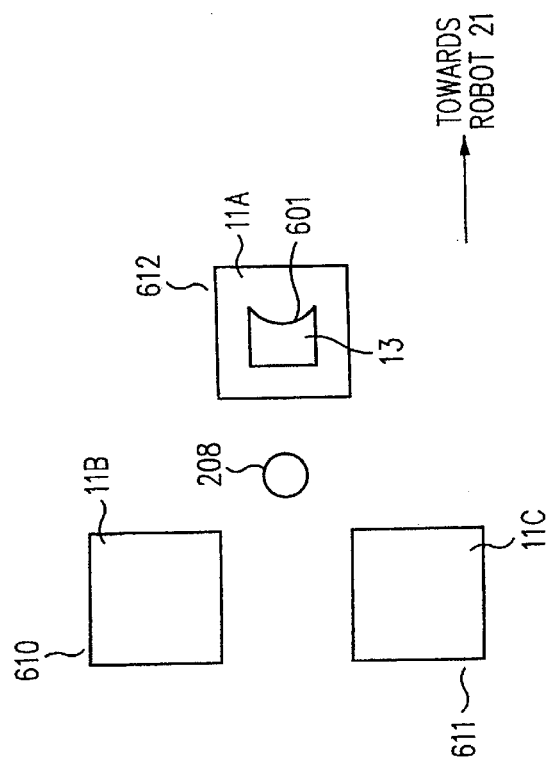
Figure 6D:
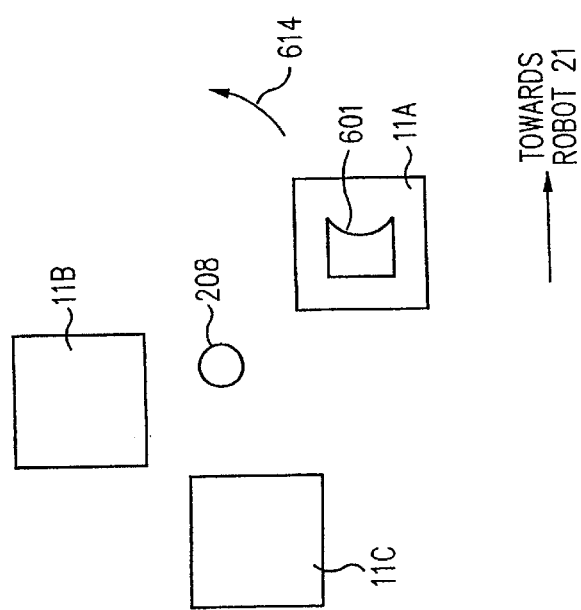
Figure 7A:
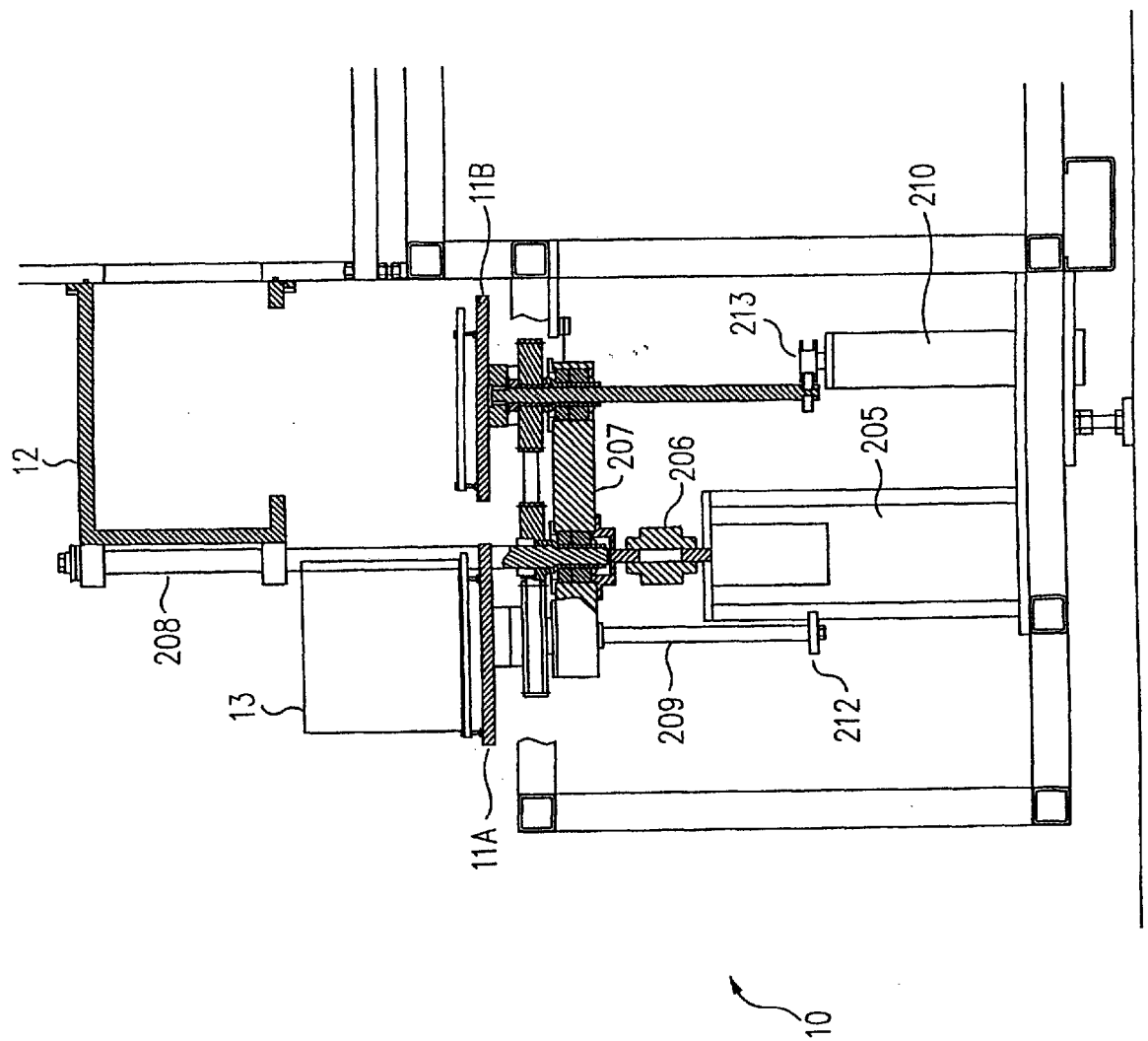
FIGS. 7A and 7B show side views of the loading station shown in FIGS. 2A and 2B.
Figure 7B:
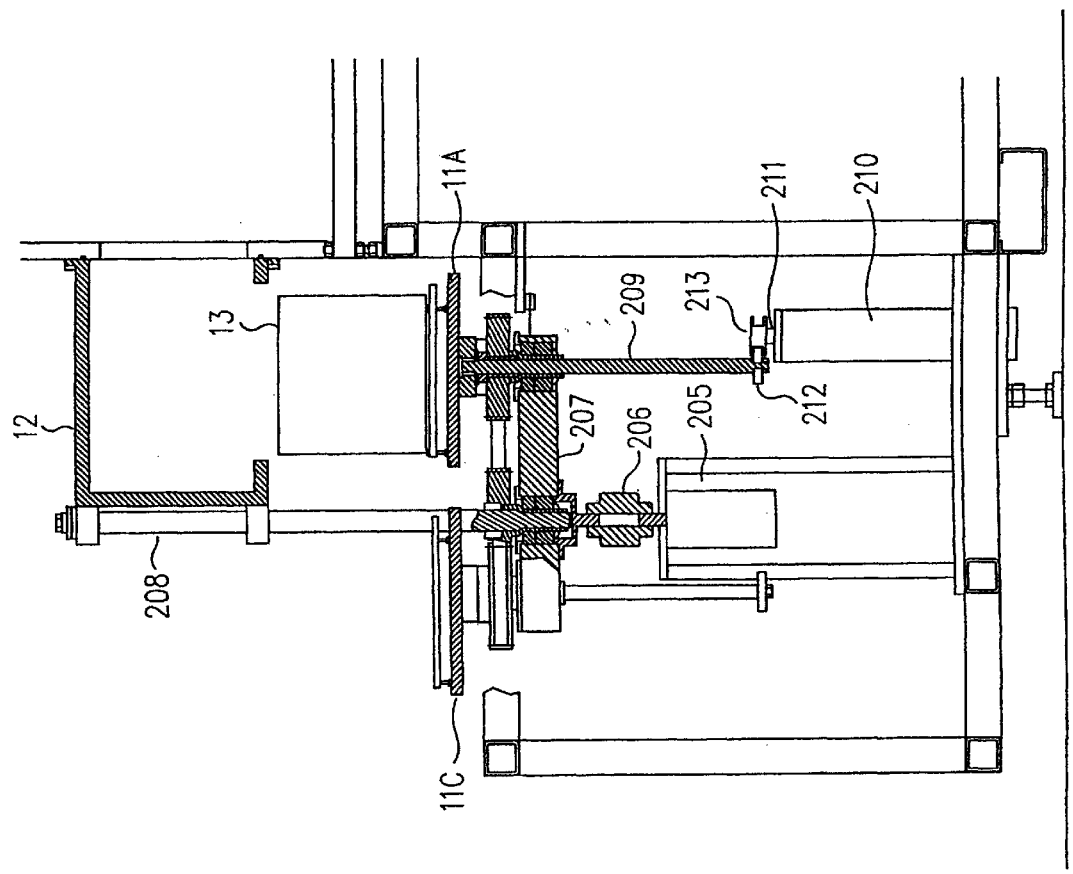

While the movement of a wafer carrier into load lock 12 is illustrated herein using carrier 13 on platform 11A as an example, the same illustration applies to the movement of other wafer carriers using platforms 11B and 11C. Further, because platforms 11A, 11B, and 11C are structurally and functionally the same, any reference to platform 11A also applies to platforms 11B and 11C. Referring to FIGS. 2A and 2B, which show a side view and a top view of loading station 10, platform 11A includes a driving bar 209 which is coupled to a triangular block 207 via bearings 217. A motor 205 is mechanically coupled to an adapter block 219 using a flexible coupler 206. Adapter block 219 is fixedly attached to triangular block 207. By rotating adapter block 219, motor 205 can thus rotate triangular block 207 which, in turn, rotates platform 11A about a pole 208. The rotation of platform 11A about pole 208 is illustrated in FIGS. 6A to 6E. FIGS. 6A to 6C sequentially show top views of platform 11A as it is rotated from a position 610 to a position 611 in a direction indicated by an arrow 613. FIG. 7A shows a side view of loading station 10 when platform 11A is in position 611. FIGS. 6C to 6E show top views of platform 11A rotating from position 611 to a position 612 in a direction indicated by an arrow 614. FIG. 7B shows a side view of loading station 10 when platform 11A is in position 612.

Referring to FIG. 2B, a belt 202 is wound through a fixed center pulley 204, fixed platform pulleys 201, and idlers 203 so that opening 601 of wafer carrier 13 through which wafers are inserted (FIGS. 6A–6E) faces towards robot 21 as platform 11A is rotated about pole 208. Tension on belt 202 is set by adjusting idlers 203.

Figure 9:
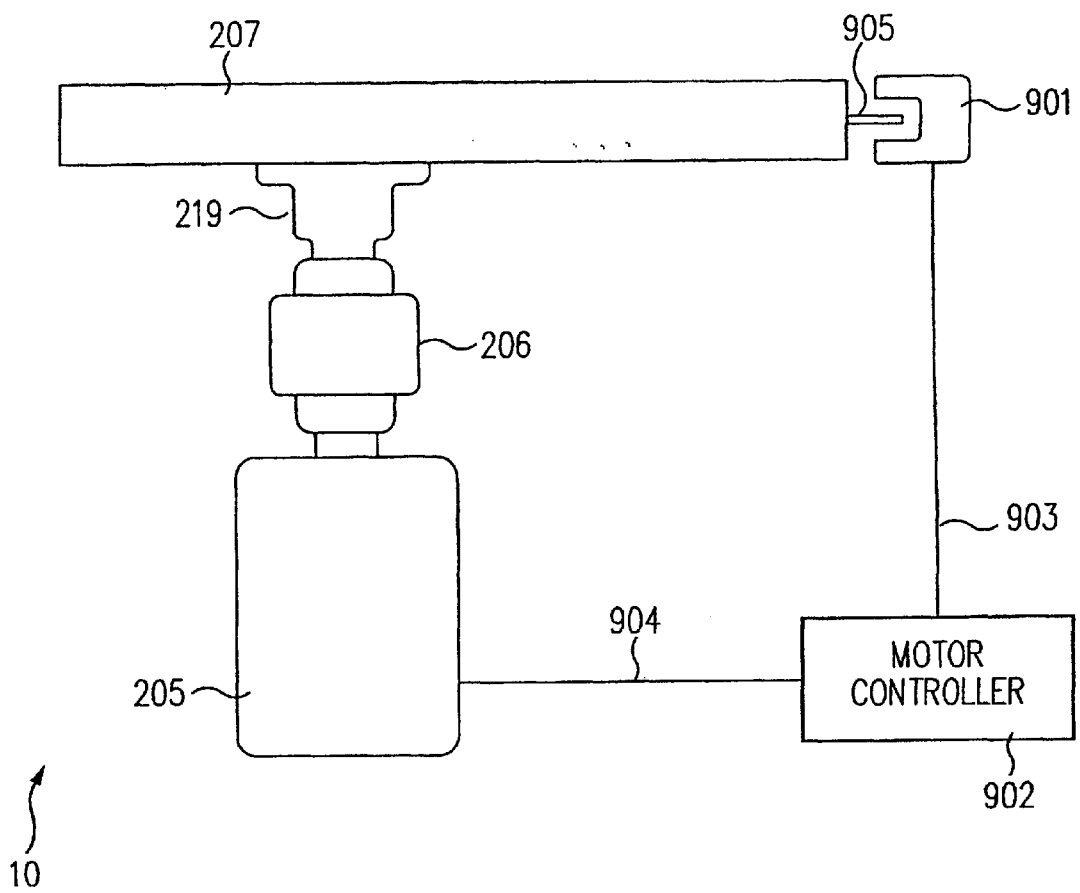
FIG. 9 shows a functional diagram of a sensor configuration for tracking the position of a platform in the loading station shown in FIGS. 2A and 2B.

Referring to FIG. 9, the position of platform 11A in loading station 10 is tracked using a sensor 901 and a flag 905. Flag 905 is attached to a predetermined location on triangular block 207. The position where flag 905 passes through sensor 901 is known as the "home" position. In one embodiment, the output of sensor 901 is coupled to a motor controller 902 via a line 903. The output of motor 205, which can be an encoder output, is also coupled to motor controller 902 via a line 904. When flag 905 passes through sensor 901, sensor 901 outputs a "home signal" to motor controller 902 indicating that triangular block 207 is in the home position. By monitoring line 904, motor controller 902 determines the number of rotation that motor 205 makes after the receipt of the home signal. Because the location of platform 11A relative to the home position is predetermined, the location of platform 11A as it rotates about pole 208 can then be tracked by motor controller 902.

Figure 3:
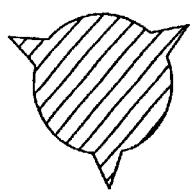
FIG. 3 shows a cross-sectional view of a bar used in the loading station shown in FIG. 2A.

As shown in FIG. 7B, a cam 212 engages a slotted disk 213 when platform 11A is in position 612. Cam 212 is attached to driving bar 209 which, in turn, is attached to platform 11A. Once motor controller 902 indicates that platform 11A is in position 612, air pressure is provided into a pneumatic cylinder 210 to push a piston 211 upwards. Consequently, slotted disk 213 engages cam 212 to push platform 11A up into load lock 12 as shown in FIG. 2A. Bar 209 has a cross-section as shown in FIG. 3, which is taken along section III—III in FIG. 2A, to prevent rotation of platform 11A during vertical motion. To avoid jarring wafer carrier 13 on platform 11A, the air pressure provided to pneumatic cylinder 210 is regulated such that a high pressure is initially provided and then gradually decreased as platform 11A approaches load lock 12.

The rotational movement of platforms 11A, 11B, and 11C into position 612 minimizes the floor space occupied by loading station 10. As is evident from FIG. 2B, loading station 10 occupies just enough area to accommodate the number of platforms used which, in the particular embodiment shown in FIG. 2B, is three.

Figure 10A:
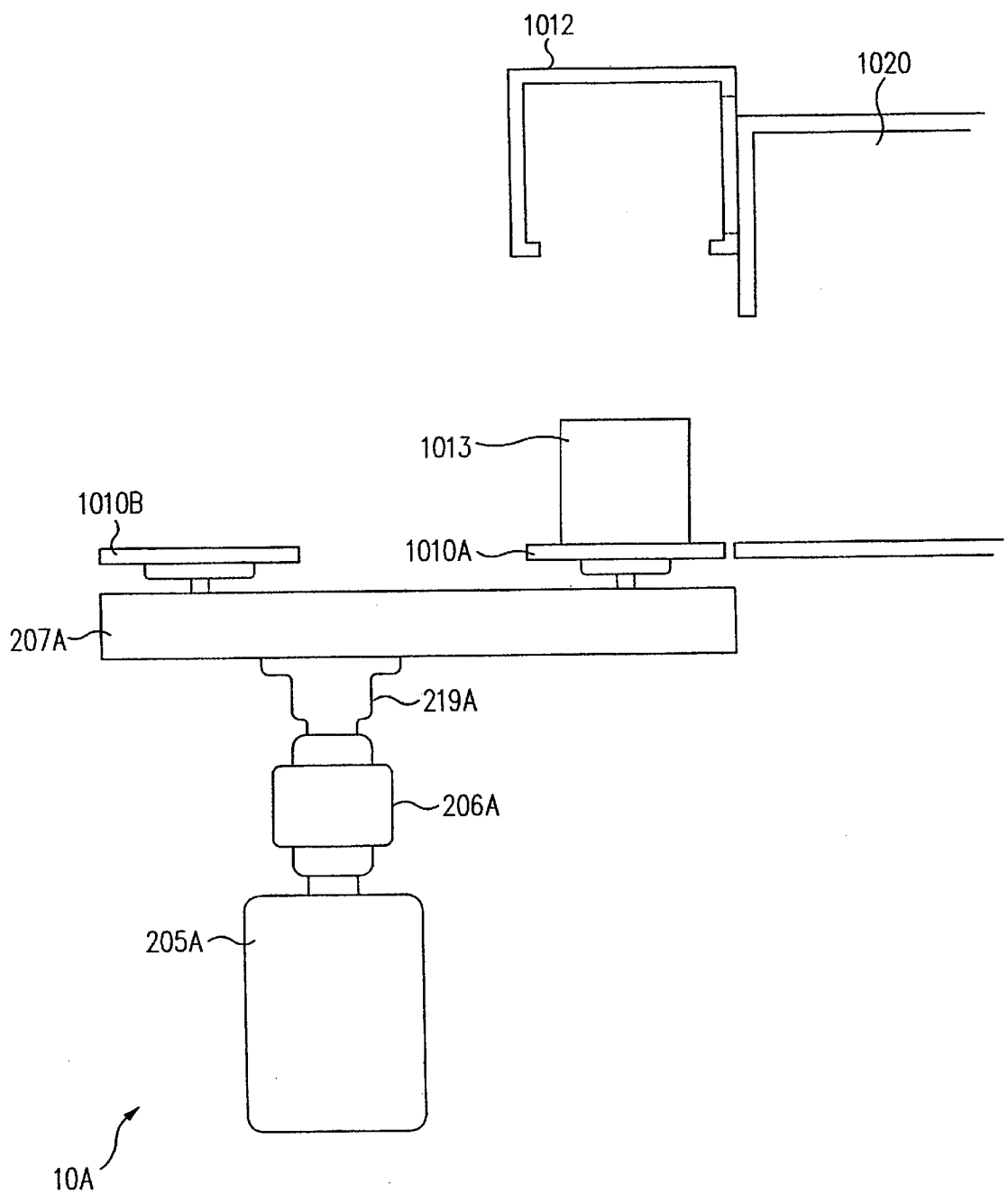
FIGS. 10A and 10B show side views of a loading station and a load lock in one embodiment of the invention.
Figure 10B:
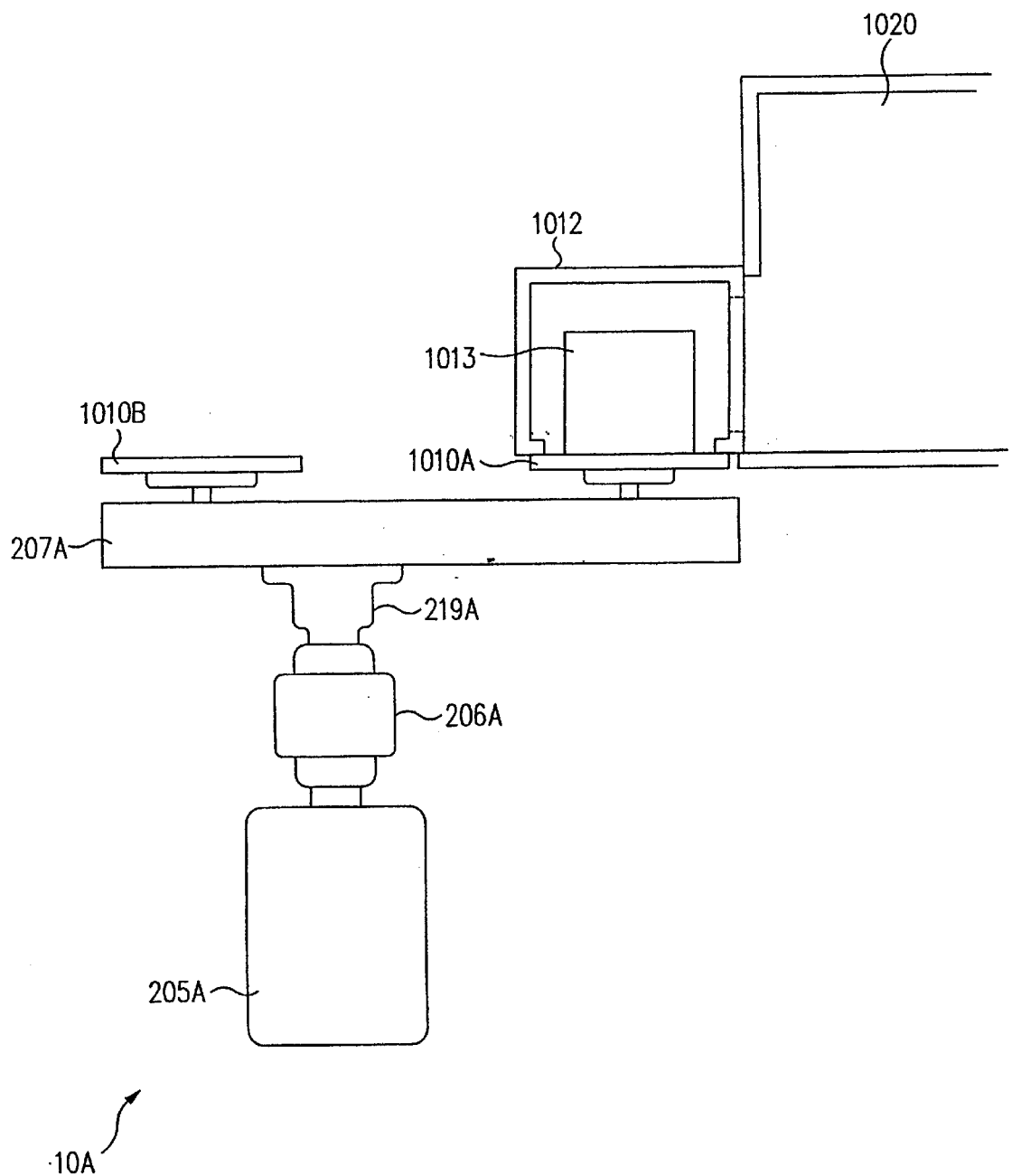

In one embodiment, the platforms of a loading station 10A, which is shown in FIG. 10A, are not elevated into a load lock 1012. In loading station 10A, a motor 205A, a flexible coupler 206A, an adapter block 219A, and a triangular block 207A are functionally and structurally the same as their counterparts in loading station 10 (i.e. motor 205A is the same as motor 205, etc.). Except for a platform 1010A not having a long driving bar such as driving bar 209 of platform 11A, platform 1010A is otherwise the same as platform 11A. In contrast to the operation of platform 11A in loading station 10, platform 1010A is not elevated into load lock 1012. Instead, platform 1010A is rotated into a position ("load lock position") where platform 1010A can be enclosed within load lock 1012. In FIG. 10A, the load lock position is just below load lock 1012. Once platform 1010A is in the load lock position, load lock 1012 is lowered to enclose platform 1010A as shown in FIG. 10B. A robot (not shown) in transfer chamber 1020 can then access the wafers in a wafer carrier 1013. Load lock 1012 is raised and lowered using conventional structures. For example, load lock 1012 can be fitted with a ball screw and then lifted by rotating the ball screw using a motor. As in loading station 10, the rotational movement of platform 1010A minimizes the floor space requirement of loading station 10A.

Figure 11A:
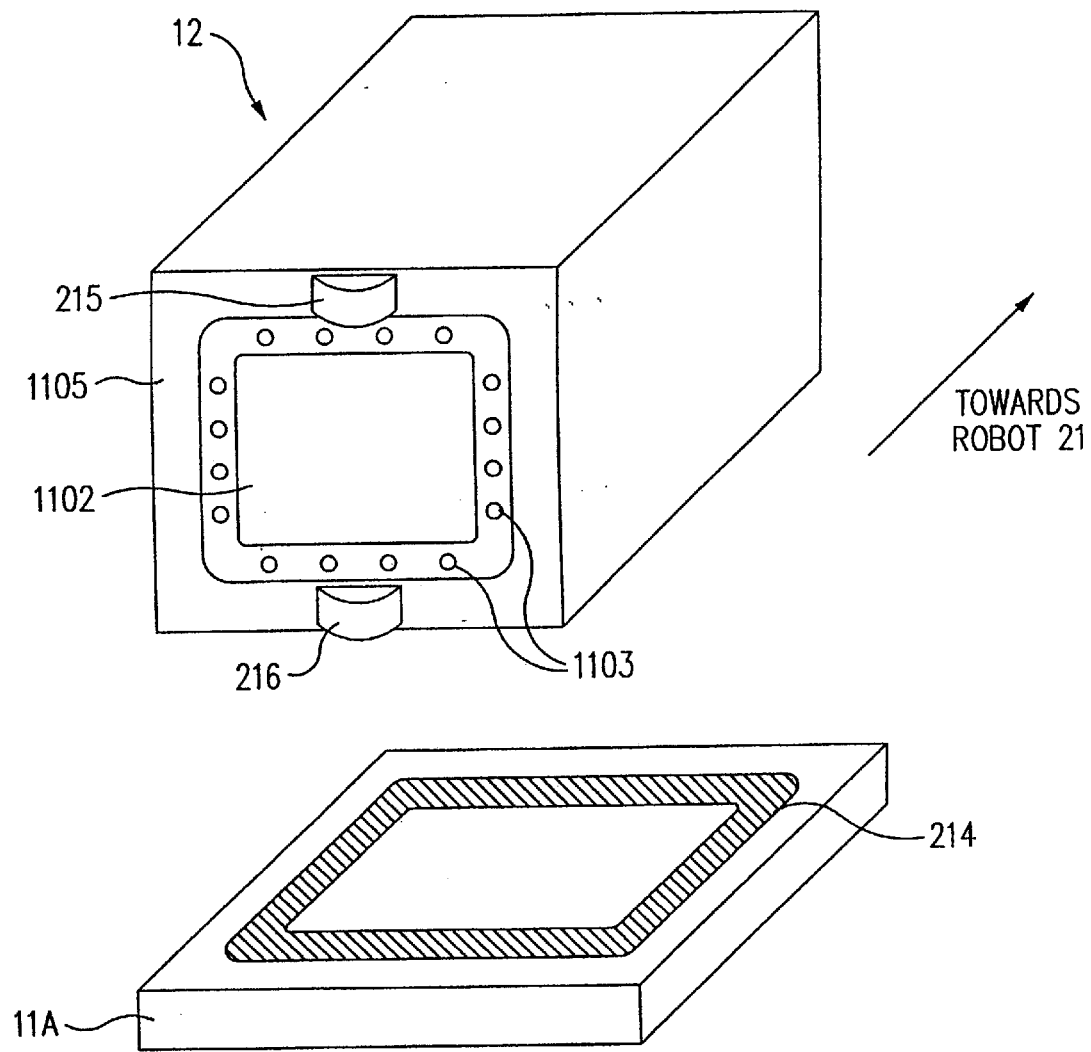
FIG. 11A shows a perspective view of a load lock and a platform in accordance with the invention.
Figure 11B:
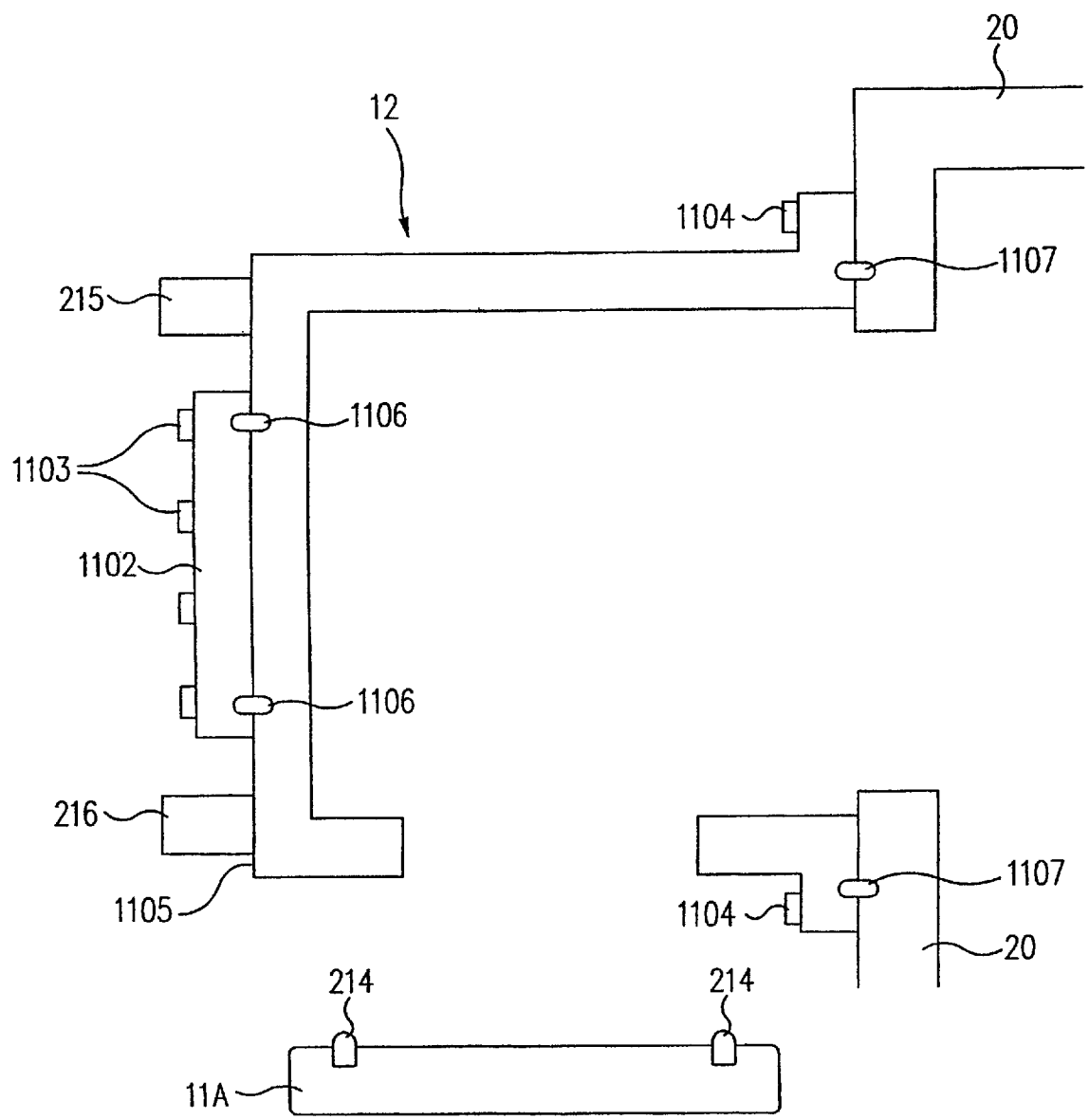
FIG. 11B shows a side cross-sectional view of the load lock and platform shown in FIG. 11A.

As shown in FIG. 2A, load lock 12 is bolted onto transfer chamber 20 and is further supported by pole 208 through hinges 215 and 216. Pole 208 freely rotates through hinge 215, hinge 216, and bearings 218 to prevent vibrations from motor 205 from being transmitted into load lock 12. FIG. 11A shows a perspective view of load lock 12. In FIG. 11A, pole 208 and other components of system 100 are not shown for clarity. Load lock 12 includes a viewing port 1102 on a side 1105 to allow visual inspection of the insides of load lock 12. Viewing port 1102 is made of a transparent material such as quartz. Referring to FIG. 11B, which shows a partial side cross-sectional view of load lock 12, viewing port 1102 is bolted on load lock 12 with bolts 1103. A surrounding seal 1106 (e.g. o-ring or lip seal) between viewing port 1102 and side 1105 is provided to create a vacuum seal. Similarly, load lock 12 is bolted on transfer chamber 20 with bolts 1104. A surrounding seal 1107 between load lock 12 and transfer chamber 20 creates a vacuum seal. When platform 11A is up in load lock 12, a surrounding seal 214 on platform 11A (FIG. 11B) contacts the bottom opening portion of load lock 12. During processing which requires vacuum, pneumatic cylinder 210 pushes platform 11A up into load lock 12 such that seal 214 is compressed against load lock 12 to create a vacuum seal. Also, vacuum within load lock 12 draws in platform 11A into load lock 12, further enhancing vacuum sealing. A saving in floor space is achieved by vertically mounting load lock 12 which, in this particular embodiment, is above loading station 10.

Figure 4A:
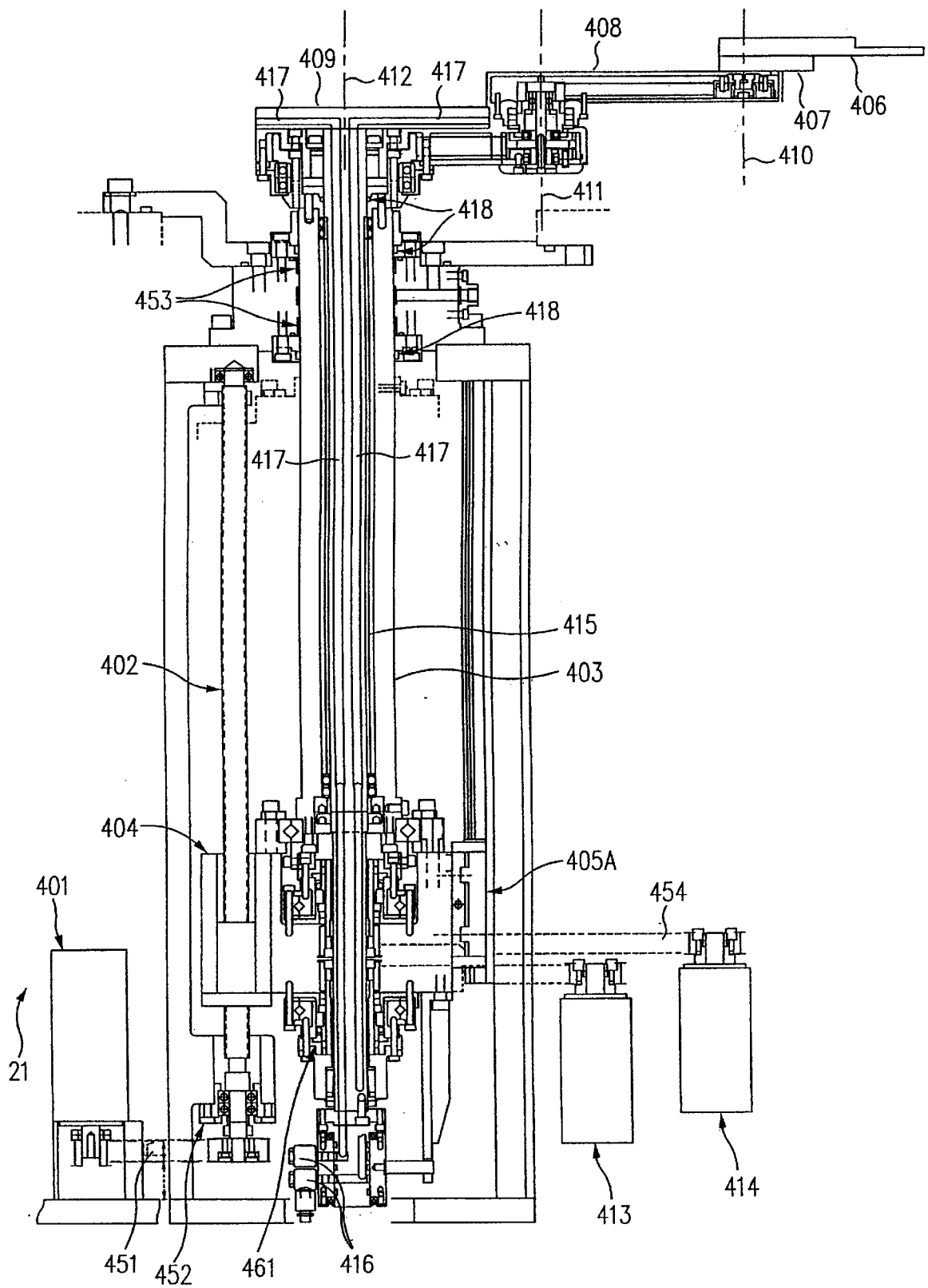
FIG. 4A shows a functional "x-ray" view of a wafer processing robot in accordance with the invention.

In accordance with the invention, robot 21 is provided for transporting wafers to and from the modules of system 100 such as reactors 30 and 40, cooling station 60, and load lock 12. FIG. 4A shows an "x-ray" view of an embodiment of robot 21. To improve the clarity of illustration by showing all the relevant parts of robot 21 in one view, FIG. 4A is a functional representation of robot 21 and does not depict actual parts placement. For example, the actual location of a ball screw 402 in relation to the location of linear guides 405A and 405B is depicted in the top view shown in FIG. 4C. Of course, the invention is not limited to the specific parts, structures, and parts placement shown in FIGS. 4A–4C. As shown in FIG. 4A, a z-axis (i.e. vertical motion) motor 401 is mechanically coupled to and rotates ball screw 402 via a belt 451. A collar 404 rides on and is driven by ball screw 402. In this embodiment, z-axis motor 401 is the type Part Number SGM-04A314B from Yaskawa Electric ("Yaskawa Electric") of Fukuoka, Japan (telephone no. 81-93-645-8800) while ball screw 402 is the type Part Number DIK2005-6RRG0+625LC5 from THK Corporation Limited ("THK") of Tokyo, Japan (telephone no. 81-3-5434-0300). Other conventional ball screws and motors can also be used. A support unit 452 (e.g. THK Part Number FK15) supports ball screw 402. A vertical driver 403, which rides on collar 404, can be moved up or down by using z-axis motor 401 to drive collar 404 via ball screw 402. Vertical driver 403 slides against wear rings 453. Wear rings, generally, prevent metal to metal contact and absorb transverse loads. In one embodiment, wear rings 453 are the type Part Number GR7300800-T51 from Busak+Shamban ("Busak+Shamban") (Internet web site "www.busakshamban.com"). Robot 21 also includes a harmonic gear 461 which can be of the same type as Part Number SHF-25-100-2UH from Harmonic Drive Systems Inc. of Tokyo, Japan (telephone no. 81-3-5471-7800).

Figure 4B:
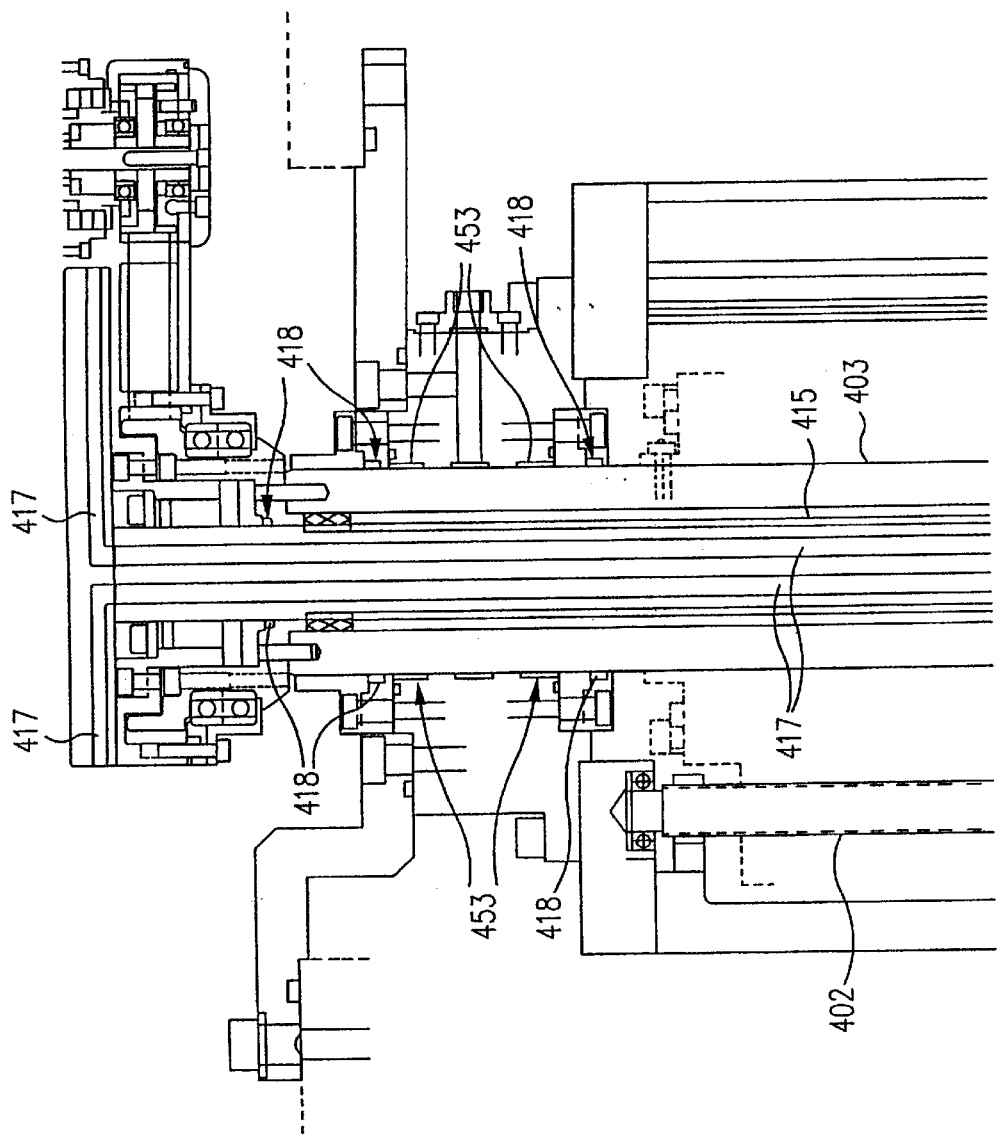
FIG. 4B shows a magnified view of a portion of the robot shown in FIG. 4A.

As shown in FIG. 4B, which is a magnified view of a portion of robot 21 defined by dashed-lines IV—IV shown in FIG. 4A, seals 418 surround vertical driver 403 and a rotation driver 415 to create a vacuum seal. Seals 418 can be any type of seal which does not expand and compress with a moving part being vacuum sealed. For example, seals 418 can be o-rings, lip-seals, or t-seals (as opposed to bellows). In one embodiment, seals 418 are of the type Part Numbers TVM300800-T01S, TVM200350-T01S from Busak+Shamban. In the prior art, bellows have been used in wafer processing robots to create a vacuum seal around a moving part such as vertical driver 403. Because bellows expand and compress with the moving part, bellows are necessarily made larger when used with moving parts having a long range of motion. This makes bellows impractical in a semiconductor processing robot having a range of motion greater than 200 mm. In one embodiment of robot 21, the use of seals 418, instead of bellows, allows vertical driver 403 to be raised up to 350 mm. Thus, robot 21 can access multiple vertically mounted modules. To keep seals 418 in place as vertical driver 403 is moved up and down, vertical driver 403 is stabilized using linear guides 405A (FIGS. 4A and 4C) and 405B (FIG. 4C) (e.g. THK Part Number HSR25LBUUC0FS+520LF-II).

Figure 4C:
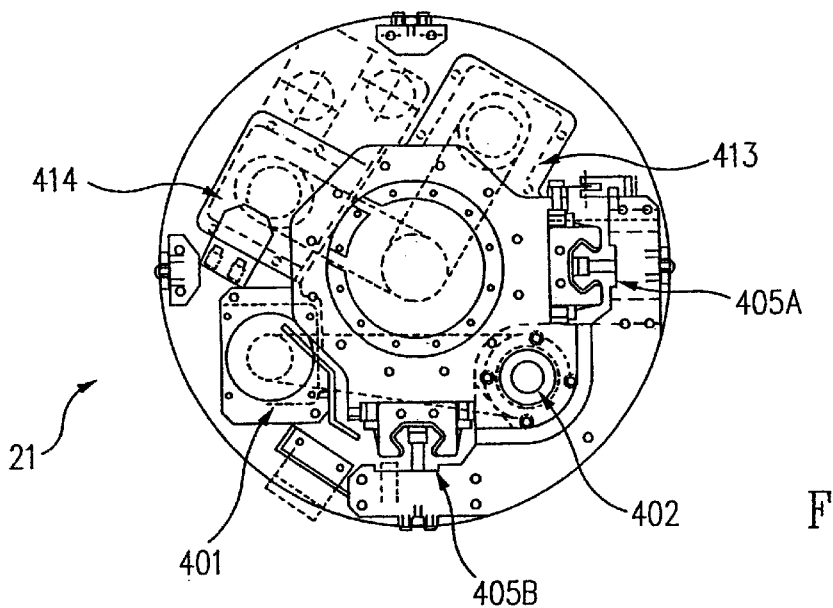
FIGS. 4C and 4D show top "x-ray" views of a robot in one embodiment of the invention.
Figure 4D:
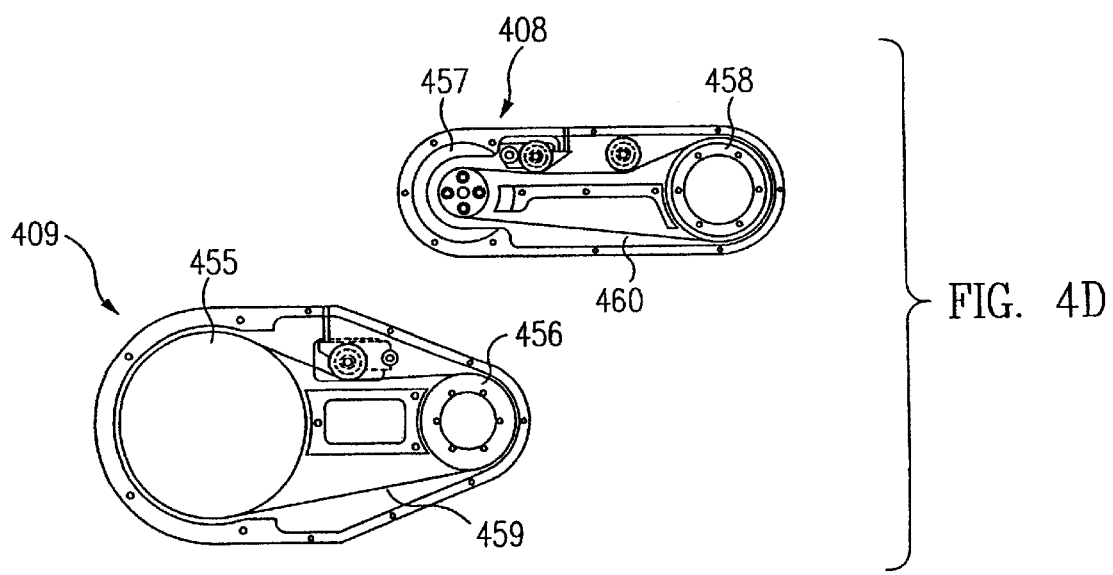

Referring to FIG. 4A, robot 21 includes an end-effector 406, which is made of a heat resistant material such as quartz, for picking-up and placing a wafer. End-effector 406 is fixedly attached to an attachment block 407 which accepts a variety of end-effectors. Block 407 is attached onto an arm 408 and rotates about an axis 410. Arm 408 rotates about an axis 411 and is attached onto an arm 409. As shown in FIG. 4D, a conventional belt and pulley arrangement, which includes pulleys 455–458 and belts 459–460, mechanically couples arm 409, arm 408, and block 407 (which is coupled to pulley 458) together. End effector 406, which is attached to block 407, can be extended or retracted along a straight line by rotating pulley 455 using an extension motor 413 (FIG. 4A) (e.g. Yaskawa Electric Part Number SGM-02AW12). The entire arm assembly consisting of arm 409, arm 408, block 407, and end-effector 406, can be rotated about an axis 412 by using a rotation motor 414 (FIG. 4A) (e.g. Yaskawa Electric Part Number SGM-02AW12) to rotate rotation driver 415 via a belt 454. FIG. 4C is a top view showing the placement of z-axis motor 402, linear guides 405A and 405B, extension motor 413, rotation motor 414, and ball screw 402 in an embodiment of robot 21.

Referring to FIG. 4A, inlets 416 are provided to allow a coolant to flow through cooling channel 417 (also shown in FIG. 4B) and cool robot 21 during high temperature processing such as RTP. Any conventional coolant may be used including water, alcohol, and cooled gas. The use of internal cooling and a heat resistant end-effector in robot 21 decreases the processing time of system 100 as robot 21 can transport a wafer in and out of a reactor without waiting for the reactor or the wafer to cool down.

Figure 8A:
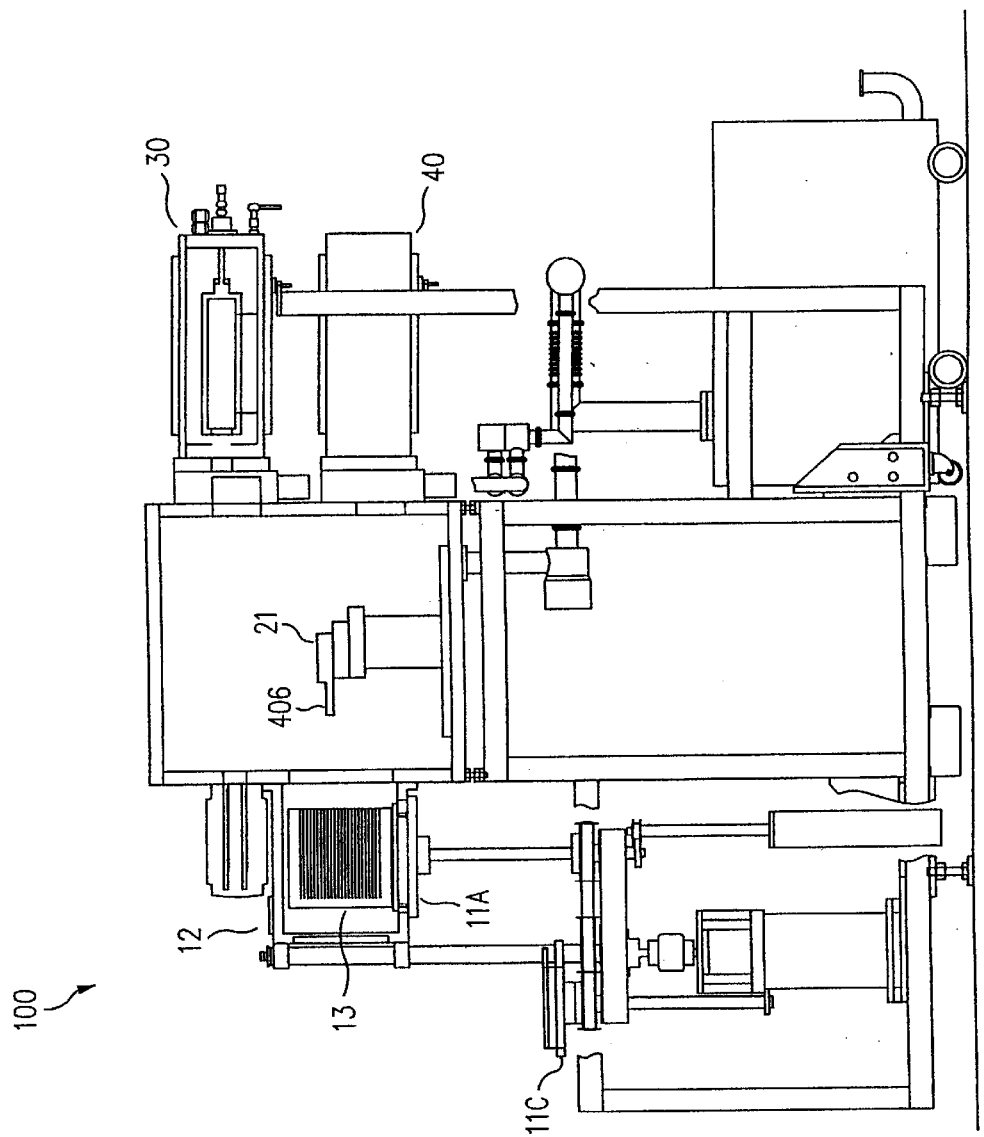
FIGS. 8A–8F show side views of the wafer processing system shown in FIG. 1A illustrating the movement of a wafer from a carrier in a load lock to a reactor.
Figure 8B:
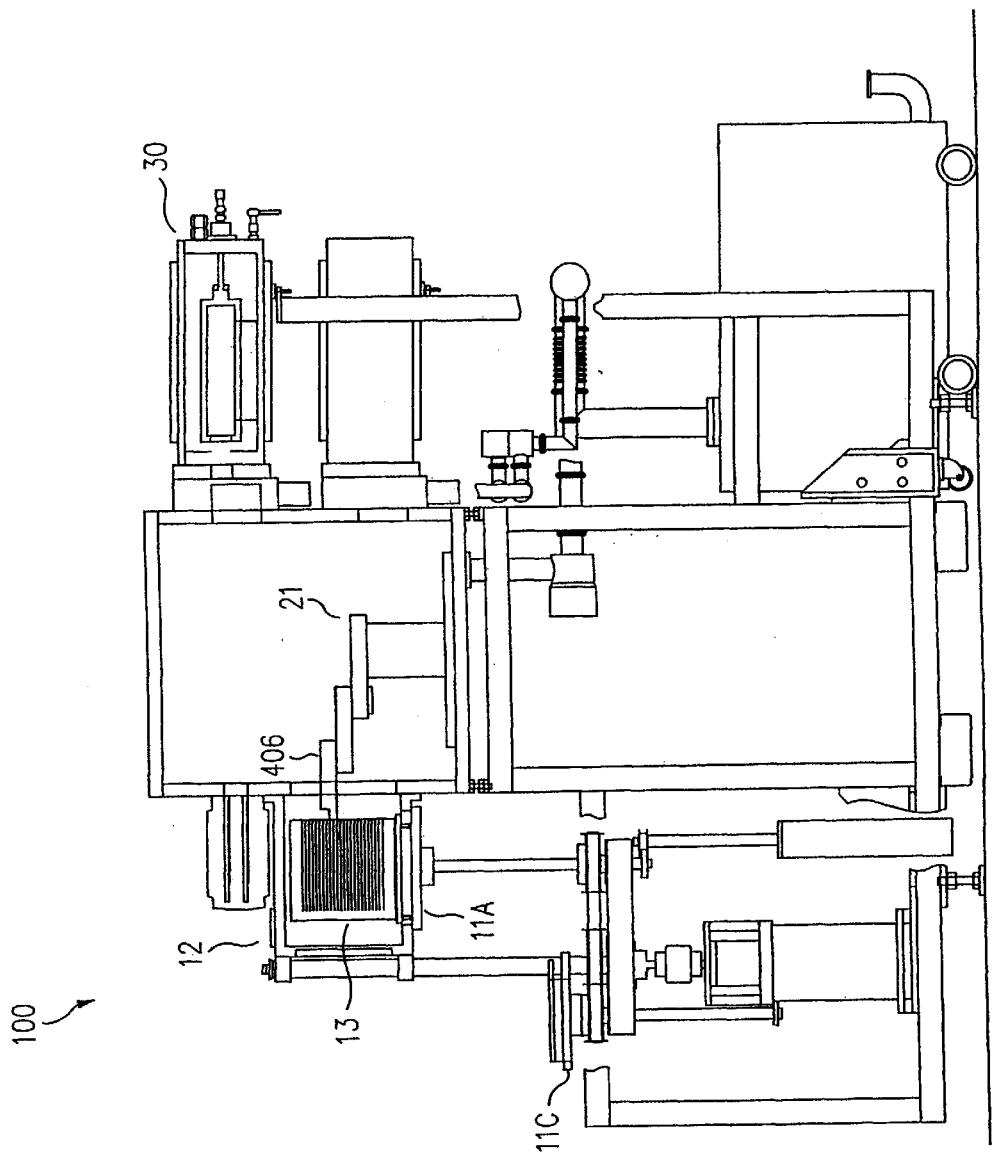
Figure 8C:
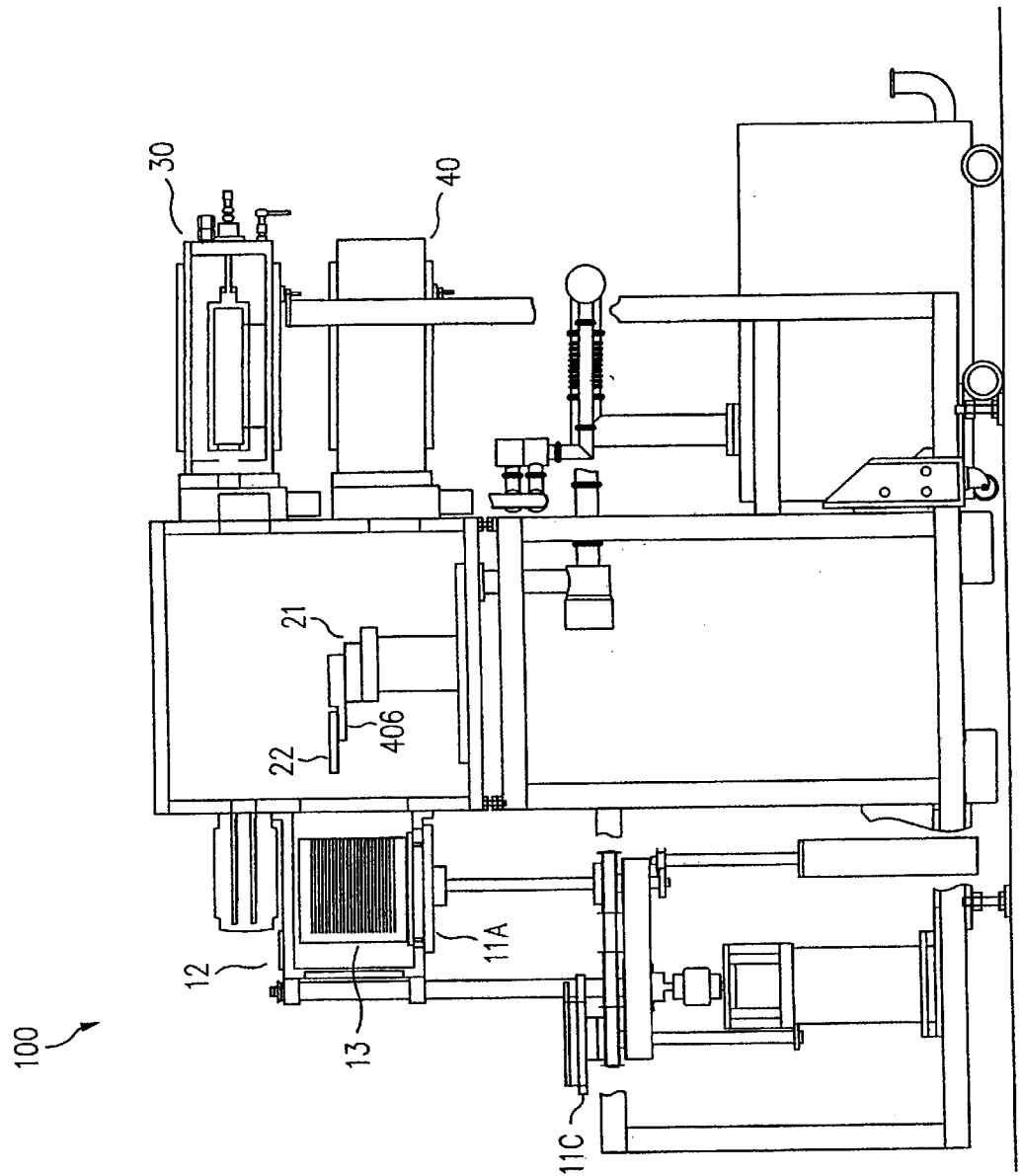
Figure 8D:
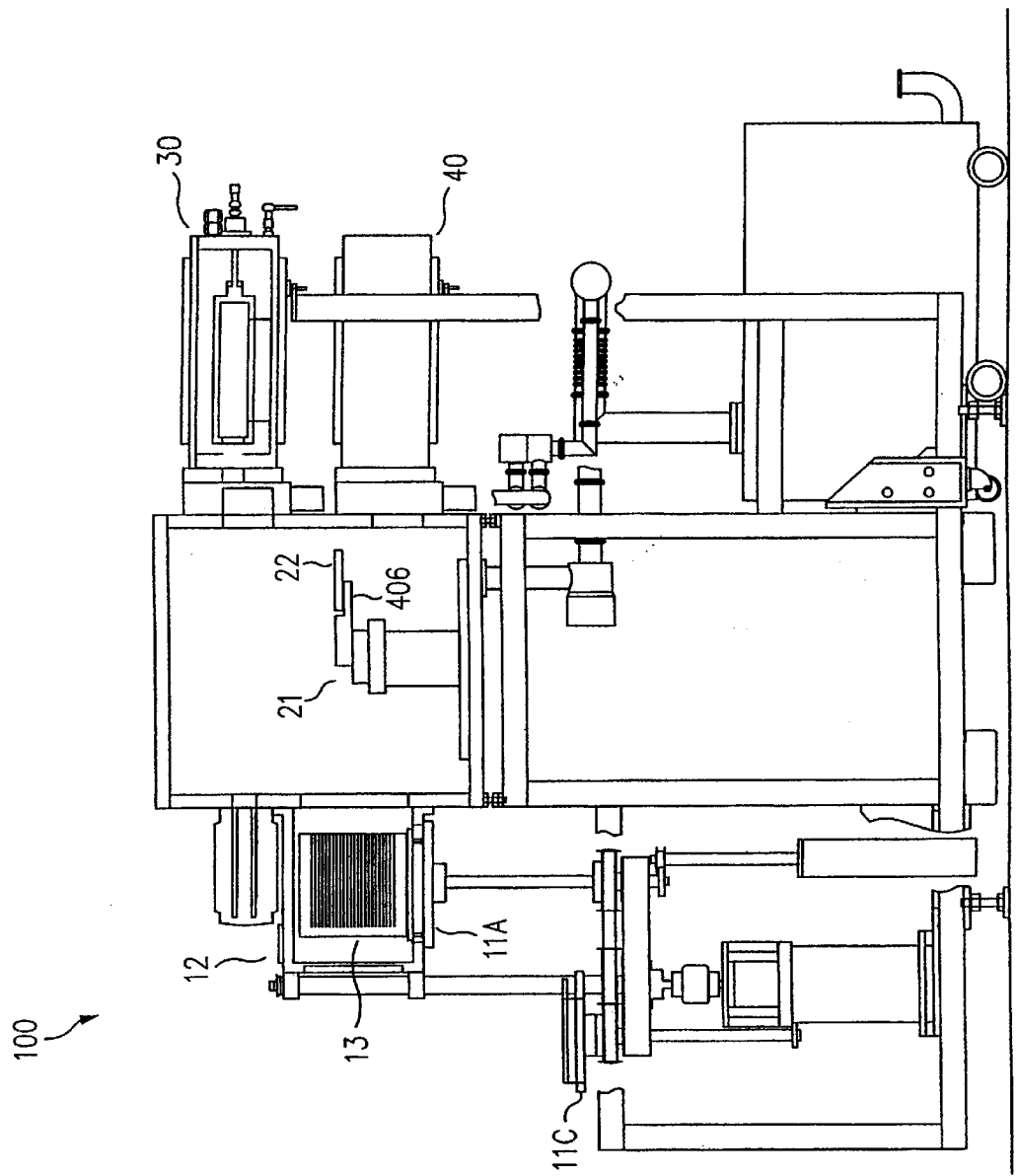
Figure 8E:
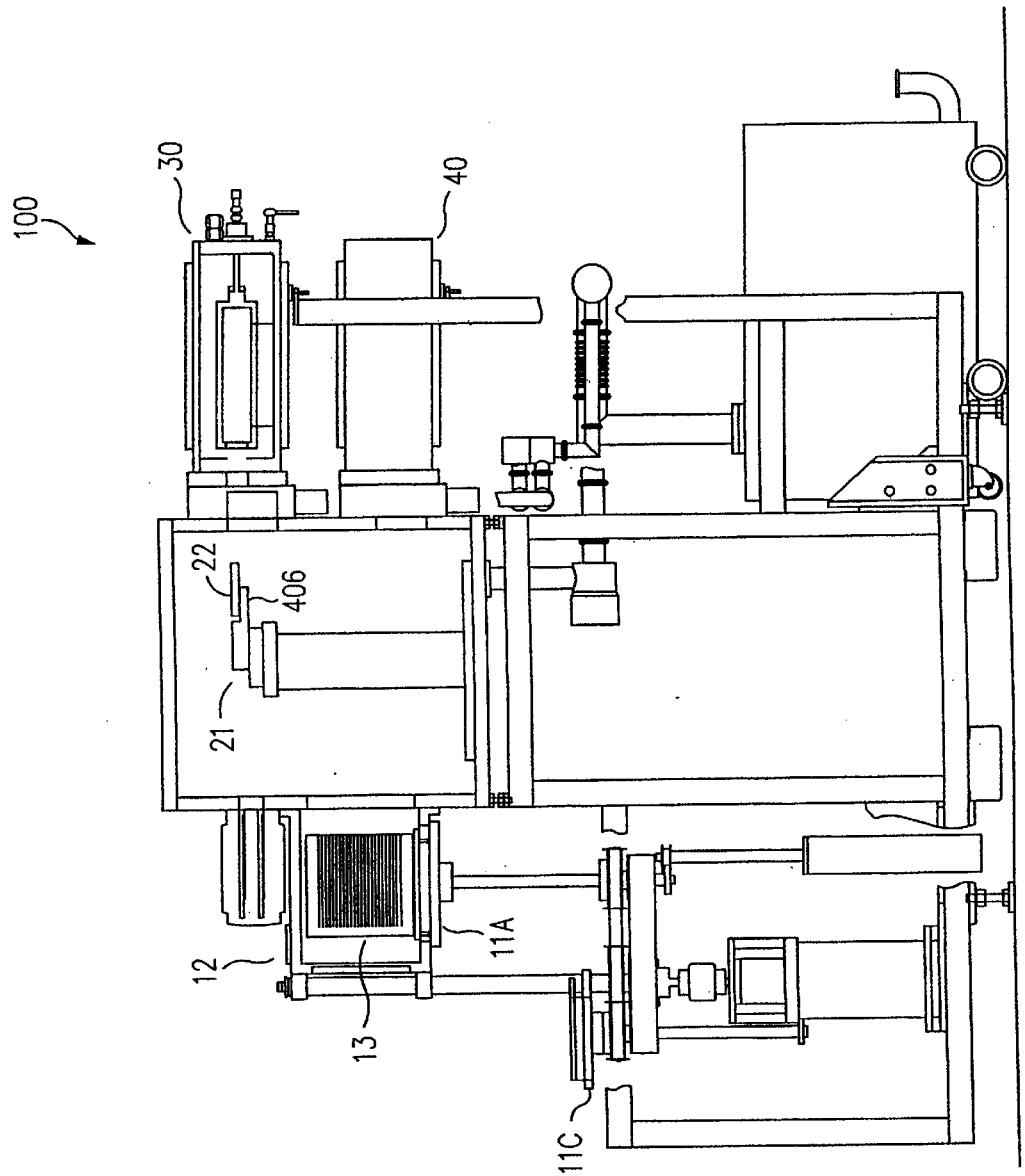
Figure 8F:
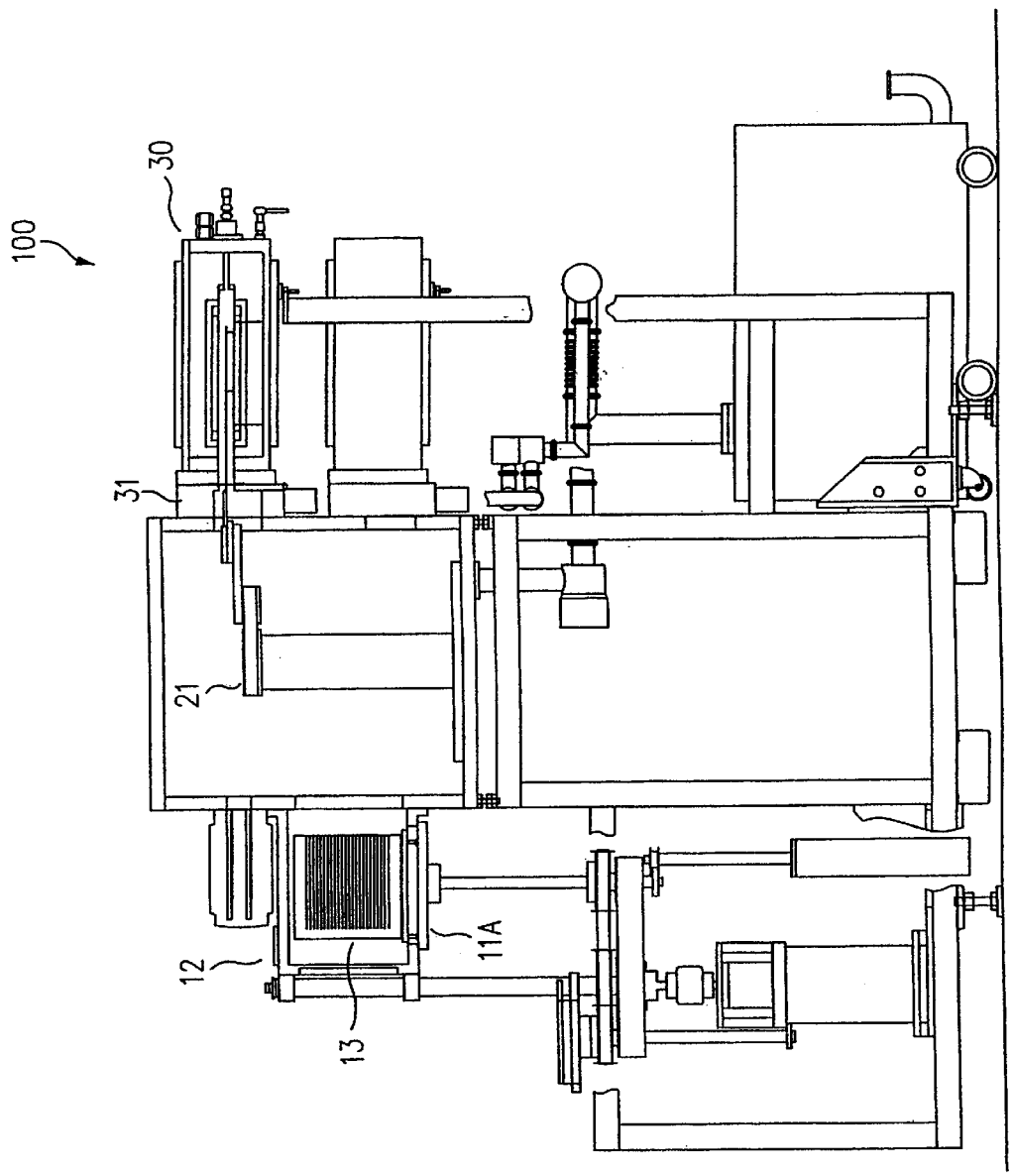

FIGS. 8A to 8F show side views of system 100 illustrating the movement of a wafer 22 from carrier 13, which is inside load lock 12, to a reactor 30 (or 40). Once carrier 13 is inside load lock 12, robot 21 in transfer chamber 20 rotates and lowers towards load lock 12 (FIG. 8A). Robot 21 extends end-effector 406 to pick up wafer 22 from wafer carrier 13 (FIG. 8B). Robot 21 then retracts (FIG. 8C), rotates towards reactor 30 (FIG. 8D), elevates to position wafer 22 in-line with reactor 30 (FIG. 8E), and places wafer 22 into reactor 30 through a gate valve 31 (FIG. 8F). Robot 21 then retracts and, subsequently, gate valve 31 closes to begin the processing of wafer 22.

Referring to FIG. 1A, reactors 30 and 40 are rapid thermal processing ("RTP") reactors in this particular embodiment. However, the invention is not limited to a specific type of reactor and may use any semiconductor processing reactor such as those used in physical vapor deposition, etching, chemical vapor deposition, and ashing. Reactors 30 and 40 may also be of the type disclosed in commonly-owned U.S. patent application Ser. No. 07/709,076, entitled "Resistively Heated Single Wafer Furnace," filed on the same date as this disclosure, which is incorporated herein by reference in its entirety. Reactors 30 and 40 are vertically mounted to save floor space. Reactors 30 and 40 are bolted onto transfer chamber 20 and are further supported by a support frame 32. Process gases, coolant, and electrical connections are provided through the rear end of reactors 30 and 40 using interfaces 33.

A pump 50, shown in FIG. 1A, is provided for use in processes requiring vacuum. In the case where the combined volume of reactors 30 and 40 is a lot less than the combined volume of load lock 12, cooling station 60, and transfer chamber 20, a single pump 50 may be used to pump down the entire volume of system 100 (i.e. combined volume of load lock 12, cooling station 60, transfer chamber 20, reactor 30, and reactor 40) to vacuum. Otherwise, additional pumps such as pump 50 may be required to separately pump down reactors 30 and 40. In this particular embodiment, a single pump 50 suffices because the combined volume of load lock 12, cooling station 60, and transfer chamber 20 is approximately 150 liters whereas the total volume of reactors 30 and 40 is approximately 2 liters. In other words, because the combined volume of reactors 30 and 40 is insignificant compared to the entire volume of system 100, reactors 30 and 40 do not significantly affect the pressure within system 100. Thus, a separate pump is not needed to control the pressure within reactors 30 and 40.

After wafer 22 is processed in a well known manner inside reactor 30 (or 40), gate valve 31 opens to allow robot 21 to move wafer 22 into cooling station 60 (FIG. 1A). Because newly processed wafers may have temperatures upwards of 200° C. and could melt or damage a typical wafer carrier, cooling station 60 is provided for cooling the wafers before placing them back into a wafer carrier in load lock 12. In this embodiment, cooling station 60 is vertically mounted above load lock 12 to minimize the floor space area occupied by system 100. Cooling station 60 includes shelves 61, which may be liquid-cooled, to support multiple wafers at a time. While two shelves are shown in FIG. 1A, of course, a different number of shelves can be used, if appropriate, to increase throughput.

Subsequently, wafer 22 is picked-up from cooling station 60 and replaced to its original slot in carrier 13 using robot 21. Platform 11A lowers from load lock 12 and rotates out of position to allow another platform to move a next wafer carrier into load lock 12.

Figure 5:
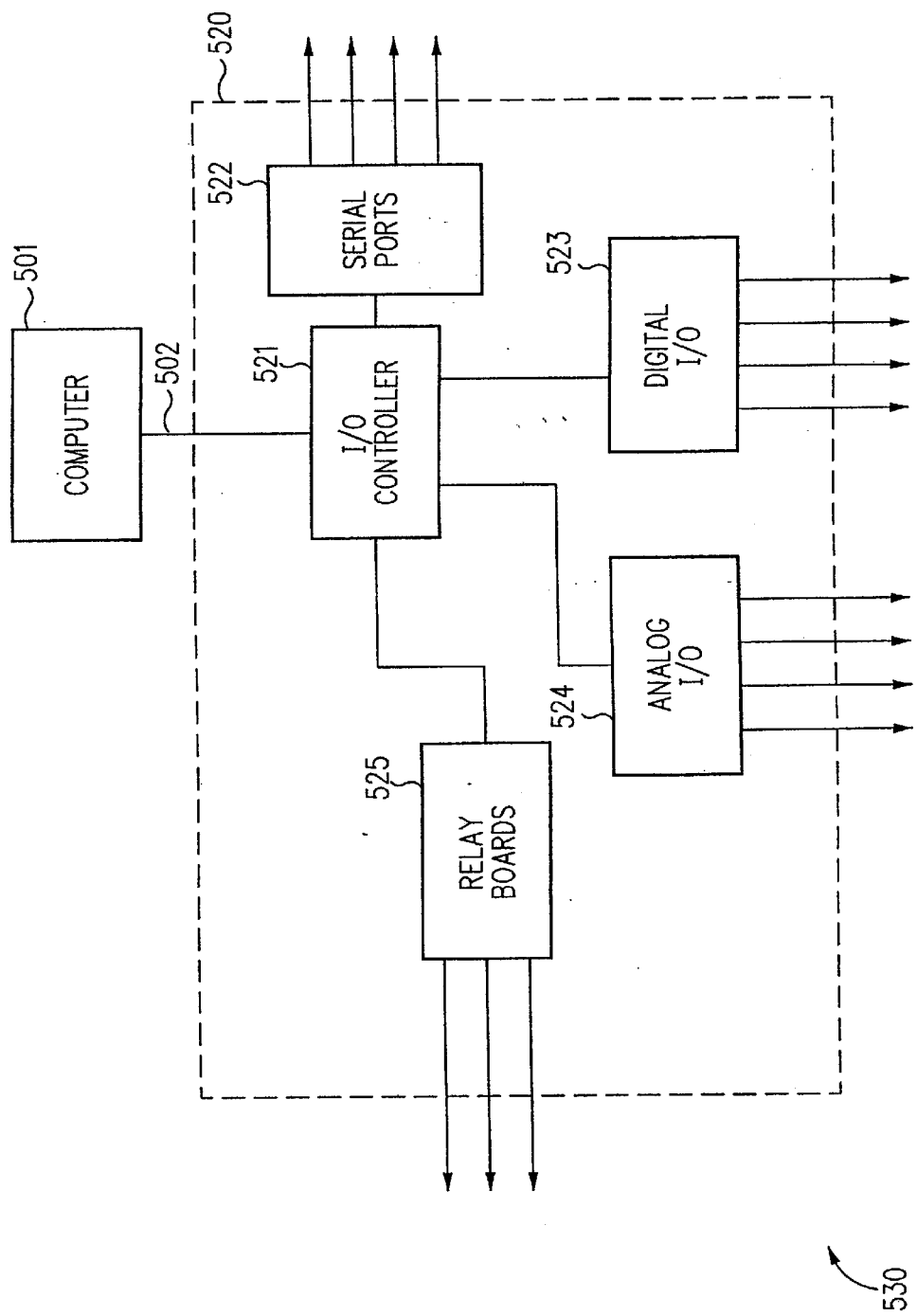
FIG. 5 shows in block diagram form a control system for controlling the wafer processing system shown in FIGS. 1A and 1B.

FIG. 5 shows a block diagram of a control system 530 used in system 100. A computer 501 communicates with a controller 520 using an ethernet link 502 to an input/output ("I/O") controller 521. I/O controller 521 can accommodate a variety of I/O boards including: (a) serial ports 522 for communicating with robot, temperature, pressure, and motor controllers (e.g. motor controller 902 shown in FIG. 9); (b) digital I/O 523 for controlling digital I/O lines such as sensors; (c) analog I/O 524 for controlling analog signal activated devices such as mass flow controllers and throttle valves; and (d) relay boards 525 for making or breaking continuity of signal lines such as interlock lines. Components for building controller 520 are commercially available from Koyo Electronics Industries Co., Ltd., 1-171 Tenjin-cho, Kodaira Tokyo 187-0004, Japan, (telephone number: 011-81-42-341-3115). Control system 530 uses a conventional control software for activating and monitoring various components of system 100. System 100 may also use any conventional control hardware and software such as those available from National Instruments Corporation of Austin, Tex. (internet website "www.ni.com").

The description of the invention given above is provided for purposes of illustration and is not intended to be limiting. The invention is set forth in the following claims.

We claim:

1. A method for a semiconductor wafer comprising:

rotating a platform configured to include a semiconductor wafer carrier containing a semiconductor wafer from a first position to a second position;

raising the semiconductor wafer carrier into a load lock;

moving the semiconductor wafer from the semiconductor wafer carrier and into a reactor;

moving the semiconductor wafer from the reactor and into the semiconductor wafer carrier;

lowering the semiconductor wafer carrier from the load lock; and rotating the platform including the semiconductor wafer carrier out of the second position.

2. The method of claim 1 further comprising moving the semiconductor wafer into a cooling station before moving the semiconductor wafer into the semiconductor wafer carrier.

3. The method of claim 1 wherein the reactor is a rapid thermal processing reactor.

4. A method for processing a semiconductor wafer comprising:

rotating a platform having a semiconductor wafer carrier disposed thereon from a first position to a second position where said semiconductor wafer carrier is moveable into a load lock;

moving a semiconductor wafer from the semiconductor wafer carrier into a reactor;

processing the semiconductor wafer;

moving the semiconductor wafer from the reactor and into the semiconductor wafer carrier; and rotating the semiconductor wafer carrier from the second position.

5. A method for moving a wafer carrier into a load lock comprising:

rotating a platform including a wafer carrier from a first position to a second position; and raising the wafer carrier into the load lock.

6. The method of claim 5 wherein the wafer carrier is a fixed wafer carrier.

* * * * *